United States Patent [19]

Schweizer

[11] Patent Number: 5,066,980

[45] Date of Patent: Nov. 19, 1991

[54] SOLENOID PLUNGER MAGNET AND ITS USE AS PRINT HAMMER IN A PRINT HAMMER DEVICE

[75] Inventor: Horst Schweizer, Wangerland, Fed. Rep. of Germany

[73] Assignee: AEG Olympia Office GmbH, Wilhelmshaven, Fed. Rep. of Germany

[21] Appl. No.: 478,007

[22] PCT Filed: Aug. 19, 1989

[86] PCT No.: PCT/DE89/00542

§ 371 Date: Apr. 30, 1990

§ 102(e) Date: Apr. 30, 1990

[87] PCT Pub. No.: WO90/03037

PCT Pub. Date: Mar. 22, 1990

[30] Foreign Application Priority Data

Sep. 1, 1988 [DE] Fed. Rep. of Germany ....... 3829676

[51] Int. Cl.$^5$ ........................... H10F 3/00; H10F 7/08

[52] U.S. Cl. .................................... 335/255; 335/257; 335/261; 335/262; 335/270; 335/271; 335/279; 335/281

[58] Field of Search ............... 335/255, 258, 261, 262, 335/279

[56] References Cited

U.S. PATENT DOCUMENTS

| | | | |
|---|---|---|---|
| 750,132 | 1/1904 | Timmis et al. | 335/261 |
| 2,407,963 | 9/1946 | Persons . | |
| 3,325,139 | 6/1967 | Diener et al. | 335/262 X |
| 3,805,204 | 4/1974 | Petersen | 335/255 |
| 4,016,965 | 4/1977 | Wirth et al. | 335/258 X |
| 4,166,991 | 9/1979 | Haner | 335/261 |
| 4,282,501 | 8/1981 | Myers | 335/258 |
| 4,604,600 | 8/1986 | Clark | 335/261 |
| 4,633,209 | 12/1986 | Belbel et al. | 335/279 X |
| 4,638,279 | 1/1987 | Brisson et al. | 335/261 X |
| 4,855,702 | 8/1989 | Swanson et al. | 335/261 |

FOREIGN PATENT DOCUMENTS

| | | | |
|---|---|---|---|
| 1683707 | 9/1954 | Fed. Rep. of Germany . | |
| 2112799 | 9/1975 | Fed. Rep. of Germany . | |
| 3318034 | 11/1984 | Fed. Rep. of Germany | 335/261 |

*Primary Examiner*—Leo P. Picard
*Assistant Examiner*—Ramon M. Barrera
*Attorney, Agent, or Firm*—Spencer & Frank

[57] ABSTRACT

A solenoid plunger magnet system is disclosed, preferably to be used as print hammer in a print hammer device. Known solenoid plunger magnets have in the exciting coil a first interferric gap as working interferric gap and a second interferric gap outside the exciting coil as loss interferric gap. The magnetic lines of force at the second gap are lost as moving forces for the solenoid plunger. The purpose of the invention is to increase the magnetic force of solenoid plunger magnets by using the second gap as well for generating forces, without affecting the generation of forces at the inner gap. For this purpose, a male taper control is arranged at the outer gap, which has a cylindrical shape and the usual length of loss gaps. A considerable increase of the magnetic force is thus achieved.

16 Claims, 2 Drawing Sheets

SOLENOID PLUNGER MAGNET AND ITS USE AS PRINT HAMMER IN A PRINT HAMMER DEVICE

BACKGROUND OF THE INVENTION

The invention relates to a solenoid plunger magnet and to its use as a print hammer in a print hammer device.

FIG. 1 shows a solenoid plunger magnet 5 as it is known from the early days of the magnetism art in the form of a blunt solenoid plunger 1 which is pulled against a flat counter-pole 2 of a yoke 3. The working air gap 4 of this solenoid plunger magnet 5 equals the length of travel of solenoid plunger 1. The result is a steeply rising tractive force curve which, particularly for long travel paths, becomes so weak at the beginning, that it is hardly possible anymore to utilize it. Furthermore, the solenoid plunger magnet 5 also has a second air gap 6, also called the loss air gap since it contributes nothing to the thrust of solenoid plunger 1. The high striking force of solenoid plunger 1 against counter-pole 2 also inevitably reduces its service life.

Therefore, the configuration of the air gaps so as to realize a maximum of performance and service life is very decisive. By appropriately designing the geometry of the plunger and of the counter-poles, it is possible to influence the characteristics over a broad range and thus to adapt them to the intended purpose. For this reason, the operating air gap is configured according to the desired lines of magnetic flux while the loss gap is configured in such a manner that it has the lowest possible magnetic resistance but does not generate forces which move in the direction toward solenoid plunger 1.

DE-OS 2,636,985 discloses a solenoid plunger system in which the second air ga is also utilized to generate magnetic forces. However, the configuration of the outer air gap disclosed there is not meaningful because it doubles the overall air gap length and thus results in a reduction of magnetic flux and a reduction of the magnetic forces in the first air gap, the working air gap.

SUMMARY OF THE INVENTION

It is the object of the invention to configure a solenoid plunger magnet in such a way that the inner air gap and the outer air gap both serve to generate forces without the overall air gap length being extended over that customary for a solenoid plunger magnet.

The solenoid plunger magnet according to the invention, with the same exterior dimensions and the same electrical data as the prior art magnets, realizes an increase in magnetic forces up to 200%. The conventional means for realizing the desired magnetic force characteristic remain fully available for the inner air gap.

BRIEF DESCRIPTION OF THE DRAWINGS

Further advantageous features of the invention will become apparent in the detailed description of the embodiments and the following drawings.

DETAILED DESCRIPTION OF THE PREFERRED EMBODIMENTS

Figure 1:
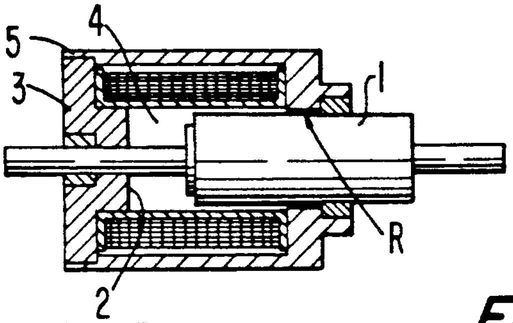
FIG. 1 PRIOR ART
FIG. 1 a solenoid plunger magnet according to the prior art.
Figure 2:
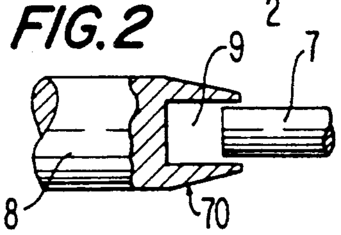
FIG. 2 the geometry of the plunger and the counterpole at the inner air gap with external cone control.
Figure 3:
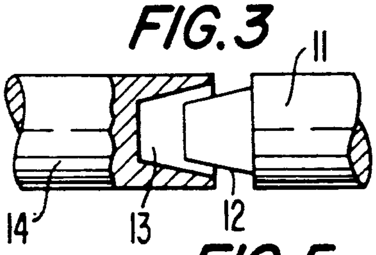
FIG. 3 the geometry of the plunger and the counterpole at the inner air gap with internal cone control.

The invention will now be described in greater detail with reference to embodiments thereof. In order to optimize the geometry of the plunger and counter-pole for the purpose of generating greater magnetic forces, FIGS. 2 and 3 illustrate examples for the configuration of the inner air gap. In FIG. 2, the plunger 7 is cylindrical, with the yoke 8 having a cylindrical recess 9 and a conically configured exterior face 10 in order to provide for external cone control. In this type of magnet, the magnetic force characteristic extends horizontally. FIG. 3 provides for internal cone control in which case the solenoid plunger 11 has a conically configured exterior face 12 and dips into a correspondingly shaped recess 13 of yoke 14. In this embodiment, the magnetic force characteristic is progressive.

Figure 4:
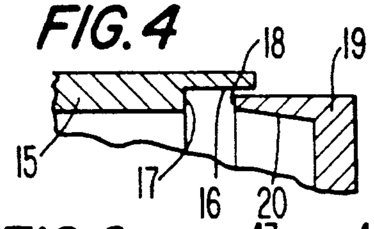
FIG. 4 the geometry of the plunger and the counterpole at the outer air gap with external cone control.
Figure 5:
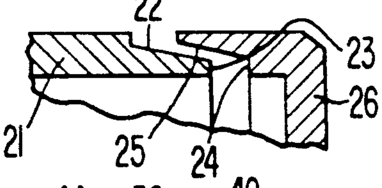
FIG. 5 the geometry of the plunger and the counterpole at the outer air gap with internal cone control.

FIGS. 4 and 5 show possible embodiments of the outer air gap, with FIG. 4 depicting an external cone control. Here, yoke 15 has a cylindrical recess 16 including an inwardly projecting stop 17 for the free end 18 of the cylindrical portion of solenoid plunger 19. In a known manner, solenoid plunger 19 has an internal cone 20.

According to FIG. 5, the outer air gap can also be controlled by way of an internal cone control, with the yoke 21 having a conical exterior face 22 and an abutment face 23 which can be charged by an abutment face 24 on plunger 26. In a known manner, solenoid plunger 26 has an internal cone 25.

Figure 6:
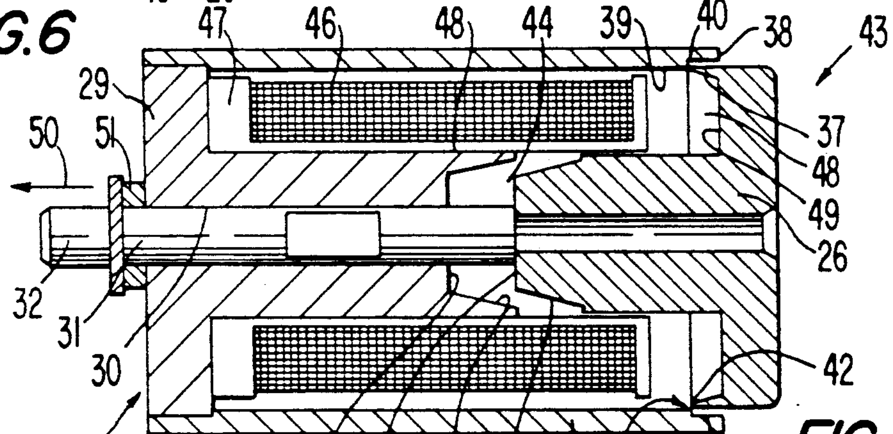
FIG. 6 the solenoid plunger magnet with internal cone control at the inner air gap and external cone control at the outer air gap.

FIG. 6 shows a solenoid plunger magnet 43 for use as print hammer in a print hammer device, with a solenoid plunger 26 being fixed to a cylindrically configured guide member 31 composed of a non-magnetic material and being displaceably mounted in a bearing bore 30 of a yoke 27. The inner air gap 44, seen in the axial direction, lies approximately in the center of an excitation coil 46 which is fastened in a known manner by means of a coil mount 47 on a cylindrical extension 48 of yoke 27. The inner air gap 44 is formed by an inner cone control, with the exterior face 33 extending toward the coil axis when excitation coil 46 is excited having a cone angle of less than 10°. This conical outer face 33 dips into a conical recess 34 serving as counter-pole until the free end 35 of plunger 26 lies against the base face 36 of yoke 27. Yoke 27 is composed of an inner member 29 including a bearing bore 30 and a cylindrical extension 48 and of a hollow cylinder 28 which is fixed to member 29, with member 29 as well as hollow cylinder 28 being composed of a high permeability material.

Guide member 31 includes a stop member 35 which, by way of a spring-tensioned lever having a hammer head, charges the type face spokes of a daisy wheel (not shown). This non-illustrated spring-tensioned lever sets guide member 31, which has been charged in the direction of arrow 50, back into its starting position once excitation coil 46 is no longer excited, with a damping member 51 of guide member 31 lying against yoke 27. This reliably avoids noises during resetting of guide member 31 into the starting position.

The outer air gap 45 is cylindrical in shape and is provided with an external cone control, with hollow cylinder 28 having a set-back cylindrical circumferential face 39 and plunger 26 having a cylindrical exterior face 28 to enable it to be immersed. The distance between the circumferential face 39 and exterior face 38 is about 0.15 mm and thus corresponds to the value of a normal loss air gap. Within cylindrical exterior face 38, plunger 26 is provided with a cavity 48 whose internal circumferential face 37 is conical so as to form an external cone control. The circumferential lines of this cone extend from the outer edge 42 to the bottom face 49 of cavity 48 in such a manner that they intersect the coil axis in a direction opposite to the direction of movement of solenoid plunger 26 when excitation coil 46 is excited. The diameter of the outer air gap 45 has a ratio of approximately 1:1 to the diameter of the exterior diameter of excitation coil 46. Moreover, the outer face 38 forming the outer air gap 45 and the inner circumferential face 39 at plunger 26 and yoke 27 are provided with edges 41, 42 as regions of denser magnetic flux which augment the forward thrust of solenoid plunger 26 at the beginning of its movement.

Figure 7:
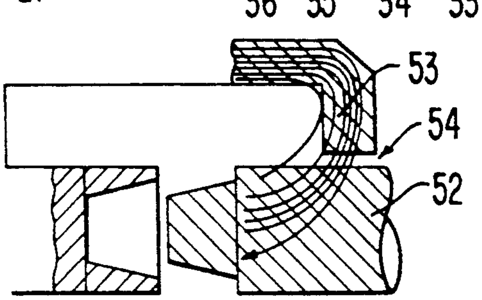
FIG. 7 PRIOR ART
FIG. 7 the magnetic flux lines at the outer air gap according to the prior art of FIG. 1.
Figure 8:
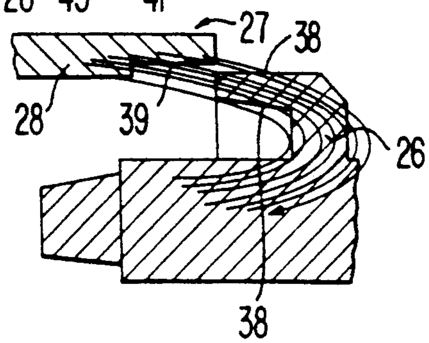
FIG. 8 the magnetic flux lines in the outer air gap for a solenoid plunger magnet according to FIG. 6.

FIG. 8 shows the favorable path of the magnetic flux lines at the outer air gap at the transition from yoke 27 to solenoid plunger 26. FIG. 7 shows the corresponding magnetic flux lines at outer air gap 54 of a yoke 53, the loss air gap. It can here be seen that the flux lines do not effectively support the movement of solenoid plunger 52. This FIG. also clearly shows the stray flux at the loss gap.

Figure 9:
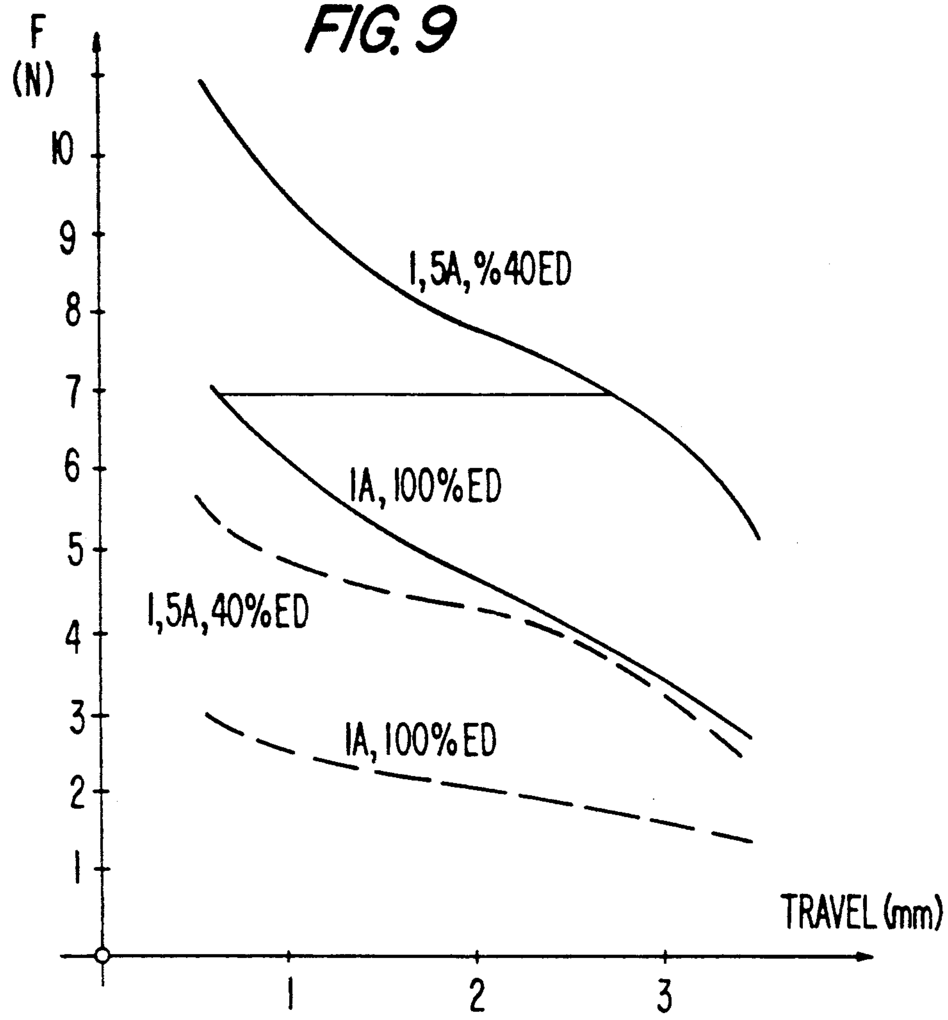
FIG. 9 force-travel curves for the solenoid plunger magnets according to FIGS. 1 and 6.

FIG. 9 shows the force-travel characteristics of solenoid plunger magnets whose inner and outer air gaps are configured according to FIGS. 7 and 8. The dashed curves show the flux lines for solenoid plunger magnets according to FIG. 7 which have a working air gap and internal cone control while the solidly drawn curves relate to solenoid plunger magnets according to FIG. 8 which have two working air gaps. The differences in performance between solenoid plunger magnets having one and two working air gaps are clearly noticeable. In each case, the excitation coil was operated at current intensities of 1 A and 1.5 A for on-periods of 40% and 10%.

Figure 10:
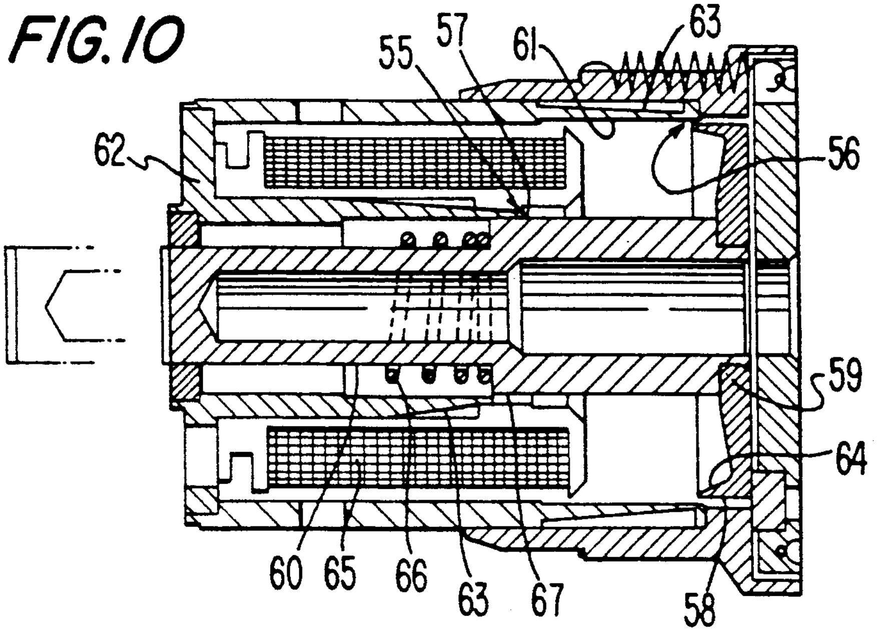
FIG. 10 a solenoid plunger magnet with external cone control at the inner and outer air gap.

A horizontal magnetic force characteristic can be realized with a solenoid plunger magnet system according to FIG. 10 in which the inner air gap 55 as well as the outer air gap 56 are cylindrical. Exterior faces 57, 58 at plunger 59 and the counter-pole faces at yoke 62 are cylindrical, with the rear face 63 of counter-pole face 60 and the rear face 64 of exterior face 58 being conical. In this way, the solenoid plunger magnet is given an external cone control at its inner (55) as well as its outer air gap 56, thus realizing the generation of uniform forces over the entire travel path. Additionally, the solenoid plunger magnet according to FIG. 10 also includes an excitation coil 65 and a reset spring 66 for solenoid plunger 59.

With the same external dimensions and the same electrical values, the proposed magnet system permits an increase of magnetic forces up to 200%.

I claim:

1. A solenoid plunger magnet comprising an excitation coil, a solenoid plunger partially projecting into this coil and a yoke of a high permeability material configured to serve as a flux guiding means for forming, together with the solenoid plunger, a path of magnetic flux for the magnetic field generated by the excitation coil, the magnet further being provided with a central recess for guiding a non-magnetic guide member along the plunger, with a first air gap being provided within the coil, when the solenoid plunger is in its starting position, and a second air gap outside the coil between a face of the solenoid plunger and a respectively adjacent, correspondingly configured counter-face of the yoke, characterized in that the faces facing the air gaps at the solenoid plunger and counter-faces of the yoke are configured in such a manner that at least one of the two air gaps is cylindrical and has an external cone control; and that the magnetic flux in both air gaps is utilized for conversion into the desired motion force component for the solenoid plunger, the faces facing the outer air gap are cylindrical, with the plunger being provided with a cavity within the cylindrical exterior face, and when seen in the direction opposite to the direction of movement of the solenoid plunger, the inner circumferential face of the cavity extends conically toward the coil axis from the outer edge to the bottom face of the cavity when the coil is excited so as to form an external cone control, and the outer and inner circumferential faces forming the outer air gap are provided with edges configured as regions of denser magnetic flux in order to augment the thrust of the plunger.

2. A solenoid plunger magnet according to claim 1, wherein the outer air gap has an internal cone control, with exterior faces extending toward the coil axis in the direction of movement of the solenoid plunger when the coil is excited enclosing a cone angle of less than 10°.

3. A solenoid plunger magnet according to claim 1 wherein when viewed in the axial direction, the inner gap lies approximately in the center of the excitation coil.

4. A solenoid plunger magnet according to claim 1, wherein the faces of the plunger facing the inner air gap and the counter-face at the yoke in the form of a recess are conical so as to form an internal cone control.

5. A solenoid plunger magnet according to claim 1, wherein the diameter of the outer air gap has a ratio of approximately 1:1 to the diameter of the coil.

6. A solenoid plunger magnet according to claim 1, wherein the yoke has a cylindrical shape and is provided with a central bearing bore in which a guide member that is fixed to the plunger is displaceably mounted.

7. A solenoid plunger magnet according to claim 6, wherein both air gaps are cylindrical.

8. A solenoid plunger magnet according to claim 7, wherein the plunger and the yoke have external cones.

9. A solenoid plunger magnet comprising:

a coil for generating a magnetic field;

a solenoid plunger having a cavity and partially projecting into said coil for providing a first air gap in said coil when said solenoid plunger is in a starting position and a second air gap outside said coil, said solenoid plunger including:

a first plunger face facing the first air gap;

a second cylindrical outer plunger face, the cavity being inside said second cylindrical outer plunger face;
a bottom plunger face partially forming the cavity;
a plunger edge adjacent to said second cylindrical outer plunger face; and
an inner circumferential plunger face extending conically with respect to the coil axis from said plunger edge to said bottom plunger face in an external cone shape;
a non-magnetic guide member connected to said solenoid plunger;
a yoke of high permeability material and supporting said coil for forming together with said solenoid plunger a path of magnetic flux, and for forming, together with said second cylindrical outer plunger face, the second air gap outside said coil, said yoke including:
a first yoke counter-face facing the first air gap;
a second cylindrical inner yoke counter-face adjacent to an corresponding to said second cylindrical outer plunger face, the second air gap being provided between said second cylindrical inner yoke counter-face and said second cylindrical outer plunger face;
a central recess for guiding said non-magnetic guide member along the coil axis; and
a yoke edge adjacent to said second cylindrical inner yoke counter-face for providing dense magnetic flux in order to augment thrust of said plunger, wherein the magnetic flux in the first and second air gaps produces a desired motion of said solenoid plunger.

10. A solenoid plunger magnet according to claim 9, wherein said yoke has a cylindrical shape and includes a central bearing bore, said guide member being displaceably mounted in said central bearing bore of said yoke.

11. A solenoid plunger magnet according to claim 10, wherein the first and second air gaps are cylindrical.

12. A solenoid plunger magnet according to claim 11, wherein said plunger and said yoke have external cones.

13. A solenoid plunger magnet according to claim 9, wherein said first yoke counter-face and said first plunger face extend toward the coil axis in the direction of movement of said solenoid plunger when said coil is excited enclosing a cone angle of less than 10°, to form an internal cone for controlling the first gap.

14. A solenoid plunger magnet according to claim 9, wherein when viewed in the axial direction, the first air lies approximately in the center of said coil.

15. A solenoid plunger magnet according to claim 9, wherein said first plunger face and said first yoke counter-face are conical so as to form an internal cone control.

16. A solenoid plunger magnet according to claim 9, wherein the outer diameter of said coil has a ratio of approximately 1:1 to the diameter of the second air gap.

* * * * *